United States Patent [19]

Kurafuji

[11] 4,390,798

[45] Jun. 28, 1983

[54] BIAS-VOLTAGE GENERATOR

[75] Inventor: Setsuo Kurafuji, Yokohama, Japan

[73] Assignee: Fujitsu Limited, Kawasaki, Japan

[21] Appl. No.: 208,384

[22] Filed: Nov. 19, 1980

[30] Foreign Application Priority Data

Nov. 22, 1979 [JP] Japan .................. 54/151777

[51] Int. Cl.³ .................. H03K 3/01; H03K 3/353
[52] U.S. Cl. .................. 307/296 R; 307/297;
307/304; 307/471; 331/108 C
[58] Field of Search .......... 307/296, 297, 304, 200 B;
331/108 C

[56] References Cited

U.S. PATENT DOCUMENTS

| | | | |
|---|---|---|---|
| 3,806,741 | 4/1974 | Smith | 307/304 |
| 4,115,710 | 9/1978 | Lou | 307/200 B |
| 4,142,114 | 2/1979 | Green | 307/297 |
| 4,266,151 | 5/1981 | Hoffman et al. | 307/297 |

*Primary Examiner*—Larry N. Anagnos
*Assistant Examiner*—B. P. Davies
*Attorney, Agent, or Firm*—Staas & Halsey

[57] ABSTRACT

A substrate bias-voltage generator is comprised of an oscillator, and a charge pumping circuit, driven by the oscillator via a coupling capacitor, which transfers accumulated electric charges, out of the semiconductor substrate. The oscillator frequency is varied in accordance with the variation of the voltage level of the semiconductor substrate, preferably by means of an RC circuit, fabricated by a MOSFET variable resistance (R) and a capacitor (C), within a ring oscillator or a multi-vibrator. The gate electrode of the MOSFET variable resistance is directly connected to the semiconductor substrate.

5 Claims, 10 Drawing Figures

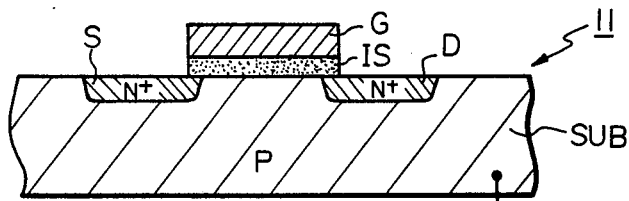
Fig. 1
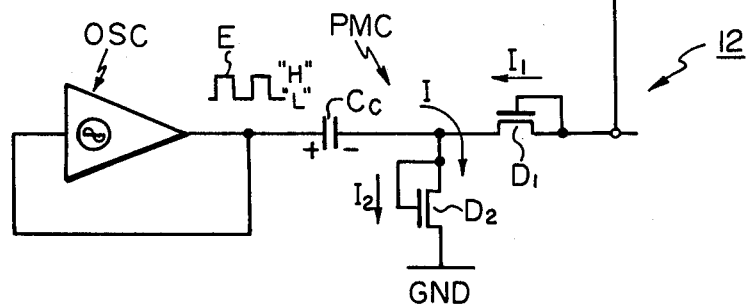
Fig. 2
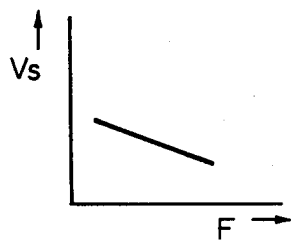
Fig. 3
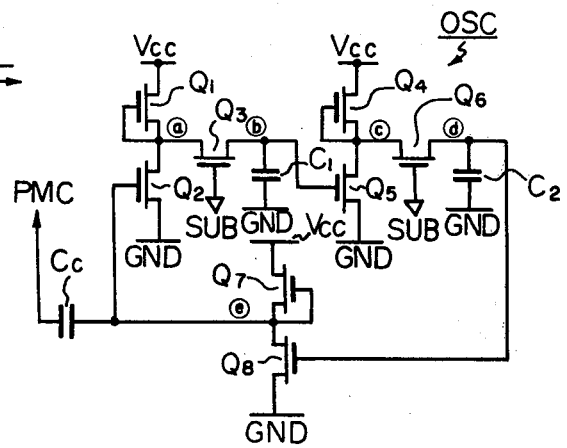

a)

b)

c)

d)

e)

BIAS-VOLTAGE GENERATOR

BACKGROUND OF THE INVENTION

The present invention relates to a bias-voltage generator, and more particularly to a bias-voltage generator producing a bias voltage to be applied to a semiconductor substrate on which a MOS (Metal Oxide Semiconductor) integrated circuit is mounted.

Generally, the MOS integrated circuit is provided with the bias-voltage generator so as to establish and maintain the desired optimum circuit operation of each of the semiconductor devices, such as FETs (Field Effect Transistors), which constitute the MOS integrated circuit. For instance, if the threshold voltage is below a specified or nominal level, the semiconductor device is unstable in operation, as it may be improperly rendered conductive by a noise signal, and is thus particularly unsuitable for use in logic circuits. However, if the threshold voltage is greater than the desired level, the speed of the operation of the semiconductor device is reduced, and the semiconductor device may fail to be turned on when an input signal is applied to the control electrode. Thus, the level of the threshold voltage must be maintained at a desired optimum level. The maintenance of the level of the threshold voltage at a desired optimum level is achieved by the bias-voltage generator, whose function is to absorb the so-called substrate current which flows through the substrate.

In the prior art, such a bias-voltage generator has been proposed in, for example U.S. Pat. No. 3,806,741, entitled SELF-BIASING TECHNIQUE FOR MOS SUBSTRATE VOLTAGE, by Frederick J. Smith. In this technique the bias-voltage generator can absorb the substrate current in such a manner that the amplitude of the current varies in accordance with the variation of the operating frequency of a dynamic-type circuit, for example a dynamic-type storage device in which there is a lower limit which respect to the operating frequency. This is because such a dynamic-type storage device is operated by using electric charges stored in the stray capacitances.

Briefly speaking, in the above mentioned prior art bias-voltage generator, the output signal to be produced from the bias-voltage generator and supplied to the substrate, varies in magnitude of the voltage thereof in accordance with the variation of the operating frequency of the dynamic-type circuit.

Contrary to the above, in the present invention, as will be explained hereinafter, the output signal to be produced from the bias-voltage generator and supplied to the substrate, varies in frequency in accordance with the variation of the voltage level of the semiconductor substrate.

In recent years, a great number of MOS devices, for fabricating a desired MOS integrated circuit, have been mounted on a single semiconductor chip with a very high degree of integration. Accordingly, in each MOS device, the channel between the drain and the source thereof should considerably be shortened in length. Thus, a very short channel must be formed therein. However, as the length of the channel becomes shorter, the intensity of the electric field created adjacent to the drain becomes stronger. As a result, an impact ionization current is induced across the electric field. At this time, separated holes and electrons move in respective directions. That is, the electrons move toward the drain, while the holes move toward the substrate. These separated holes and electrons create a bad effect on the normal operation of a MOS integrated circuit. In particular, the holes absorbed into the substrate create a serious problem. This is because the voltage level of the substrate, with respect to a ground of a MOS integrated circuit, is unnecessarily increased by the holes themselves, from the optimum voltage level.

SUMMARY OF THE INVENTION

Therefore, it is an object of the present invention to provide a bias-voltage generator which can also suppress the undesired increase of the voltage level of the semiconductor substrate.

BRIEF DESCRIPTION OF THE DRAWING

The present invention will be more apparent from the ensuing descriptions with reference to the accompanying drawings wherein:

FIG. 1 illustrates both a typical conventional MOSFET, as a sectional view thereof, and a conventional bias-voltage generator, as an equivalent circuit diagram thereof;

FIG. 2 is a graph used for explaining a relationship between the oscillating frequency F of an oscillating AC signal E shown in FIG. 1 and the voltage level Vs of a substrate SUB shown in FIG. 1;

FIG. 3 illustrates an equivalent circuit diagram of a first embodiment for constructing an oscillator including RC circuits according to the present invention;

DESCRIPTION OF THE PREFERRED EMBODIMENTS

Figure 4:
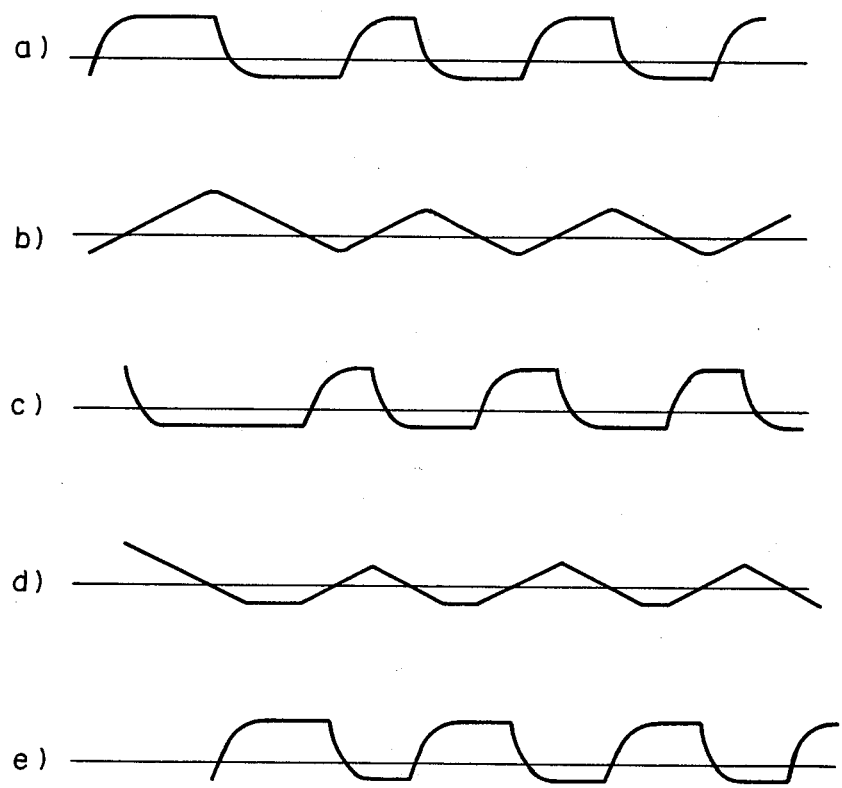
FIG. 4 depicts waveforms of signals appearing in the circuit shown in FIG. 3.

In FIG. 1, which illustrates both a typical conventional MOSFET, as a sectional view thereof, and a conventional bias-voltage generator, as an equivalent circuit diagram, the reference numeral 11 represents the typical conventional MOSFET, as a sectional view thereof, and the reference numeral 12 represents the conventional bias-voltage generator. The MOSFET 11 is comprised of a semiconductor substrate SUB, for example a P-type substrate, a source S, which is an $N^+$-type region formed in the substrate SUB, a drain D, which also is an $N^+$-type region formed therein, and a gate electrode G, which is a conductive layer of e.g., aluminum or poly-silicon. The conductive layer (G) is formed on a thin insulation layer IS, made of silicon dioxide ($SiO_2$). The insulation layer IS is located above the channel created between the source S and the drain D.

As previously mentioned, the length of the channel is very short, so as to realize a MOS integrated circuit with a high degree of integration. Therefore, holes are absorbed into the substrate SUB due to the presence of the impact ionization current. Thus the voltage level of the substrate SUB varies in accordance with the variation of the amplitude of the impact ionization current.

However, the conventional bias-voltage generator 12 cannot respond to such variation of the voltage level of the substrate SUB, but merely functions to absorb the constant substrate current. The operation of the conventional bias-voltage generator 12 is as follows. The generator 12 is comprised of an oscillator OSC producing an oscillating AC signal E therefrom, a coupling capacitor Cc connected, at one end, to the oscillator OSC, a charge pumping circuit PMC connected, firstly to the other end of the coupling capacitor Cc, secondly to a ground GND of the MOS integrated circuit, and lastly to the substrate SUB on which the MOS integrated circuit is mounted. The charge pumping circuit PMC is comprised of a first diode $D_1$ and a second diode $D_2$. To be more specific, the diode $D_1$ is made up of a MOSFET in which the drain and the gate electrode thereof are shorted. Therefore, a current $I_1$ flows in the direction of the arrow shown in FIG. 1. The diode $D_2$ is made of a MOSFET in which the drain and the gate electrode thereof are shorted. Therefore, a current $I_2$ flows in the direction of the arrow indicated in FIG. 1. The bias-voltage generator 12, including a charge pumping circuit PMC therein, has merit in that the generator 12 does not require a two-level voltage source, but only a single voltage source.

When the MOS integrated circuit, mounted on the substrate SUB is activated, and accordingly the bias-voltage generator 12 is also activated, the generator 12 produces the oscillating AC signal E. The signal E is a pulse train, the voltage level of which changes between "H" (high) level and "L" (low) level, alternately. When the voltage level is "H", the current $I_2$ flows through the coupling capacitor Cc and the diode $D_2$, to the ground GND. The ground GND is a ground of the MOS integrated circuit and is not electrically connected to the substrate SUB. When the current $I_2$ flows through the capacitor Cc (at this time, the current $I_1$ does not flow), the capacitor Cc is charged with polarities $(+, -)$ indicated in FIG. 1. Next, when the signal E having the level "L" is produced, the current $I_1$ flows through the diode $D_1$ and the capacitor Cc, into the oscillator OSC (at this time, the current $I_2$ does not flow). Since the current $I_1$ is created by electric charges (holes), accumulated in the substrate SUB, the voltage level of the substrate SUB can be reduced as the current $I_1$ is absorbed from the substrate SUB. Thus, the voltage level of the substrate SUB is maintained at a negative level, such as $-3V$, with respect to the level of the ground GND. It should be noted that the conventional charge pumping circuit PMC absorbs a constant amount of electric charges (holes) per unit of time from the substrate SUB. Consequently, the circuit PMC cannot proportionally follow the variation of the voltage level of the substrate SUB, induced by the variation of the amplitude of the impact ionization current.

Although the bias-voltage generator, which is disclosed in the aforesaid U.S. Pat. No. 3,806,741, can proportionally follow the variation of the operating frequency of the dynamic-type device, it cannot follow the variation of the voltage level of the substrate SUB, so that the voltage level cannot be maintained at a predetermined optimum level. In addition, the bias-voltage generator of the U.S. Pat. No. 3,806,741 follows said variation of the operating frequency by controlling the level of the magnitude of the voltage level of the output signal to be produced therefrom.

In the present invention, the bias-voltage generator can follow the variation of the voltage level of the substrate SUB. Further, the bias-voltage generator of the present invention does not require a special means for monitoring the variation of the voltage level of the substrate SUB. Furthermore, the bias-voltage generator of the present invention does not operate to vary the level of the magnitude of the voltage level of the oscillating AC signal, as does the generator of the aforesaid U.S. patent, but instead varies the oscillating frequency of the oscillating AC signal E. If the oscillating frequency of the signal E is relatively high, the voltage level of the substrate SUB decreases toward a negative level sharply, while, if the oscillating frequency of the signal E is relatively low, the voltage level of the substrate SUB increases toward a positive level. The relationship between the frequency F of the signal E and the voltage level Vs of the substrate will be clarified with reference to a graph depicted in FIG. 2. As seen from the graph of FIG. 2, the voltage level Vs has a linear relationship with respect to the oscillating frequency F. As will be apparent from descriptions mentioned hereinafter, the voltage level Vs can easily and simply be controlled by varying the oscillating frequency F, when compared with the prior art control by varying the level of the magnitude of the oscillating AC signal. Thus, an oscillator (OSC), contained in the bias-voltage generator according to the present invention, produces the oscillating AC signal having variable frequency. The frequency thereof varies in proportion to the variation of the voltage level of the substrate SUB. To be more specific, the oscillator contains therein a means for varying the frequency of the AC signal, based on the voltage level of the substrate SUB. The means for varying the frequency, according to the present invention, is constructed as an RC circuit, comprised of a capacitor (C) and a variable resistance (R). The resistance value of the variable resistance (R) varies in reverse proportion to the voltage level of the substrate SUB. To achieve this, the resistance value of the variable resistance (R) might be controlled by a means for monitoring the variation of the voltage level of the substrate SUB. However, according to the present invention, such a means for monitoring is not required, but instead a MOSFET is employed, the gate of which is directly connected to the substrate SUB. Further it should be noted that the MOSFET also functions as the variable resistance itself of the RC circuit, simultaneously. The capacitor (C) of the RC circuit can be fabricated, as is usually done, by an insulation layer, such as silicon dioxide ($SiO_2$), formed on the surface of the substrate SUB.

As previously mentioned, the oscillator contains therein the RC circuit and cooperates therewith. FIG. 3 illustrates an equivalent circuit diagram of a first embodiment for constructing the oscillator (OSC) including the RC circuit therein, according to the present invention. The oscillator OSC of the present invention is comprised of an odd number of inverters and at least one RC circuit, connected in series so as to form a ring oscillator, as shown in FIG. 3. To be specific, three inverters and two CR circuits are used. The first inverter is comprised of MOSFETs $Q_1$ and $Q_2$, the second inverter is comprised of MOSFETs $Q_4$ and $Q_5$, and the third inverter is comprised of MOSFETs $Q_7$ and $Q_8$. In each of the MOSFETs $Q_1$, $Q_4$ and $Q_7$, the MOSFET is a depletion-type MOSFET, and the gate electrode and the source thereof are shorted. The MOSFETs $Q_1$, $Q_4$ and $Q_7$ respectively function as load transistors with respect to the MOSFETs $Q_2$, $Q_5$ and $Q_8$. In order to prevent the MOSFETs $Q_1$, $Q_4$ and $Q_7$ from being fully cut off, these MOSFETs are preferably depletion-type MOSFETs. If at least one of these MOSFETs is cut off, the oscillator OSC will stop oscillating. Each of the MOSFETs $Q_2$, $Q_5$ and $Q_8$ is an enhancement-type MOSFET. If there were no RC circuits, the oscillator would produce an AC signal having a constant oscillating frequency which is defined by a delay time obtained when the AC signal passes through each inverter. However, the oscillator OSC of FIG. 3 produces an AC signal E having variable oscillating frequency, because at least one RC circuit is inserted between two adjacent inverters. Since the resistance value of the resistance (R) in the RC circuit is variable, the oscillator OSC acts as a variable oscillator. A first RC circuit is comprised of both a MOSFET $Q_3$ and a capacitor $C_1$, and a second RC circuit is comprised of both a MOSFET $Q_6$ and a capacitor $C_2$. These MOSFETs $Q_3$ and $Q_6$ are preferably depletion-type MOSFETs. It should be noted that, although one end of each inverter and also one end of each capacitor are connected to the ground GND of the MOS integrated circuit, mounted on the substrate, the gate electrodes of the MOSFETs ($Q_3$, $Q_6$), for forming the CR circuits, are connected directly to the substrate. Thus, the MOSFETs $Q_3$ and $Q_6$ can respond to the voltage level of the substrate. Since the MOSFETs $Q_3$ and $Q_6$ of FIG. 3 are made of N-channel MOSFETs, the MOSFETs $Q_3$ and $Q_6$ gain a high degree of conductivity, that is respective mutual conductances ($g_m$) increase, when the voltage level of the substrate goes toward "H" level. At this time, the equivalent resistance values of these MOSFETs $Q_3$ and $Q_6$ reduce, and accordingly respective time constants $\tau_1$, defined by the resistor ($Q_3$) and the capacitor ($C_1$), and $\tau_2$, defined by the resistor ($Q_6$) and the capacitor ($C_2$), are made small, respectively. Then the oscillating frequency of the oscillator OSC is made high. Thus, the AC signal E having a high frequency is supplied, via the coupling capacitor Cc, to the charge pumping circuit PMC. As a result, the electric charges (holes), accumulated in the substrate, are quickly absorbed by the circuit PMC, and thereby the voltage level of the substrate goes toward "L" level.

Contrary to the above, when the voltage level of the substrate goes toward "L" level, the equivalent resistance values of these MOSFETs $Q_3$ and $Q_6$ increase and accordingly the respective time constants $\tau_1$, defined by the resistor ($Q_3$) and the capacitor ($C_1$), and $\tau_2$, defined by the resistor ($Q_6$) and the capacitor ($C_2$), are made large. Then the oscillating frequency of the oscillator OSC is made low. Thus, the AC signal E having a low frequency is supplied, via the coupling capacitor Cc, to the charge pumping circuit PMC. As a result, the electric charges (holes), accumulated in the substrate, are less rapidly absorbed by the circuit PMC, and thereby the voltage level of the substrate goes toward "H" level.

FIG. 4 depicts waveforms of signals appearing in the circuit shown in FIG. 3. The waveforms of rows (a), (b), (c), (d) and (e) correspond respectively to waveforms of signals appearing at portions ⓐ, ⓑ, ⓒ, ⓓ and ⓔ indicated in FIG. 3.

Figure 5:
FIG. 5 depicts waveforms of signals appearing in the circuit shown in FIG. 3, provided that one of the RC circuits is removed therefrom.
Figure 5:
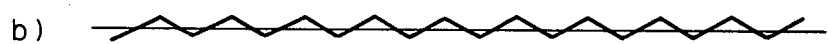
Figure 5:
Figure 5:
Figure 5:

As previously mentioned, at least one RC circuit is incorporated into the oscillator OSC in FIG. 3. Accordingly, either the first RC circuit or the second RC circuit may be removed from the oscillator OSC. FIG. 5 depicts waveform of signals appearing in the circuit shown in FIG. 3, provided that the second RC circuit ($Q_6$, $C_2$) is not incorporated in the oscillator OSC. In FIG. 5, rows (a), (b), (c), (d) and (e) respectively depict the waveforms of signals appearing at the portions ⓐ, ⓑ, ⓒ, ⓓ and ⓔ shown in FIG. 3.

Comparing the waveforms of FIG. 4 with the waveforms of FIG. 5, it may be concluded that the oscillator OSC, including two RC circuits therein, has a capability for more quickly following the variation of the voltage level of the substrate, than that of the oscillator which includes only one RC circuit therein. This is because, the integration of the signals depicted in row (e) of FIG. 4, is larger than that of the signals depicted in row (e) of FIG. 5, which integration is proportional to the electric charges (holes) to be absorbed from the substrate.

Figure 6:
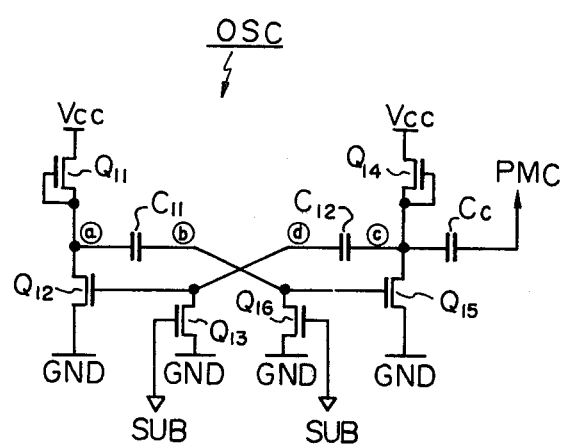
FIG. 6 illustrates an equivalent circuit diagram of a second embodiment for constructing an oscillator, including the RC circuits according to the present invention.
Figure 7:
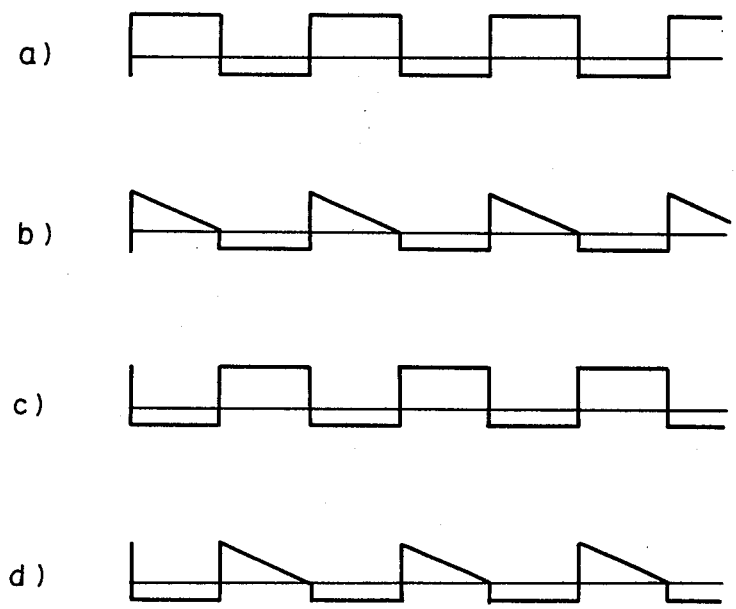
FIG. 7 depicts waveforms of signals appearing in the circuit shown in FIG. 6.

FIG. 6 illustrates an equivalent circuit diagram of a second embodiment for constructing the oscillator OSC, including the RC circuits therein, according to the present invention. The oscillator OSC, shown in FIG. 6, of the present invention is constructed as a multivibrator, comprised of MOSFETs $Q_{11}$, $Q_{12}$, $Q_{13}$, $Q_{14}$, $Q_{15}$ and $Q_{16}$. RC circuits, identical to the aforesaid RC circuits, are formed respectively by the MOSFET $Q_{13}$ and a capacitor $C_{12}$, and the MOSFET $Q_{16}$ and a capacitor $C_{11}$. The drain of the MOSFET $Q_{12}$ and the gate electrode of the MOSFET $Q_{15}$ are interconnected with each other, via the capacitor $C_{11}$. Similarly, the drain of the MOSFET $Q_{15}$ and the gate electrode of the MOSFET $Q_{12}$ are interconnected with each other, via the capacitor $C_{12}$. The MOSFETs $Q_{11}$ and $Q_{12}$ form an inverter. The MOSFETs $Q_{14}$ and $Q_{15}$ form an inverter. The gate electrodes of the MOSFETs $Q_{13}$ and $Q_{16}$ are directly connected to the substrate (SUB), as the MOSFETs $Q_3$ and $Q_6$ of FIG. 3 are. The oscillating AC signal E is supplied to the charge pumping circuit PMC (see FIG. 1), via the coupling capacitor Cc. The oscillating frequency of the oscillator OSC varies under control of the MOSFETs $Q_{13}$ and $Q_{16}$, in proportion to the voltage level of the substrate. FIG. 7 depicts waveforms of signals appearing in the circuit shown in FIG. 6. In FIG. 7, rows (a), (b), (c) and (d) depict waveforms of signals appearing at portions ⓐ, ⓑ, ⓒ and ⓓ shown in FIG. 6, respectively.

Figure 8:
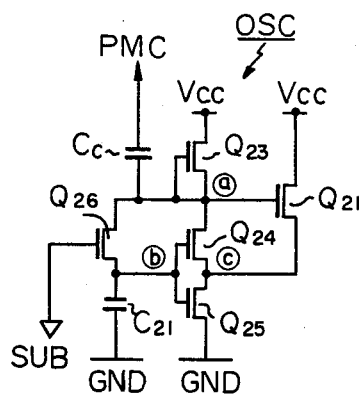
FIG. 8 illustrates an equivalent circuit diagram of a third embodiment for constructing an oscillator, including the CR circuit according to the present invention.
Figure 9:
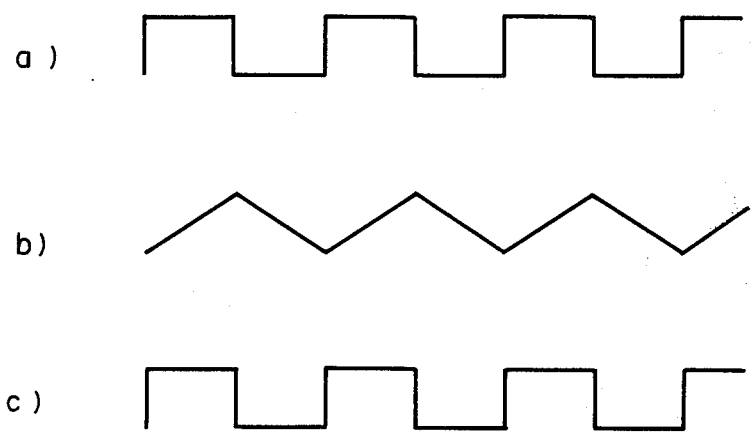
FIG. 9 depicts waveforms of signals appearing in the circuit shown in FIG. 8.

FIG. 8 illustrates an equivalent circuit diagram of a third embodiment for constructing the oscillator OSC, including the RC circuit therein, according to the present invention. The oscillator, shown in FIG. 8, of the present invention includes the RC circuit, comprised of a MOSFET $Q_{26}$ and a capacitor $C_{21}$. The operation of the oscillator will be apparent from waveforms of signals depicted in FIG. 9. The waveforms depicted in rows (a), (b) and (c), respectively represent the waveforms of signals appearing at portions ⓐ, ⓑ and ⓒ, indicated in FIG. 8.

Figure 10:
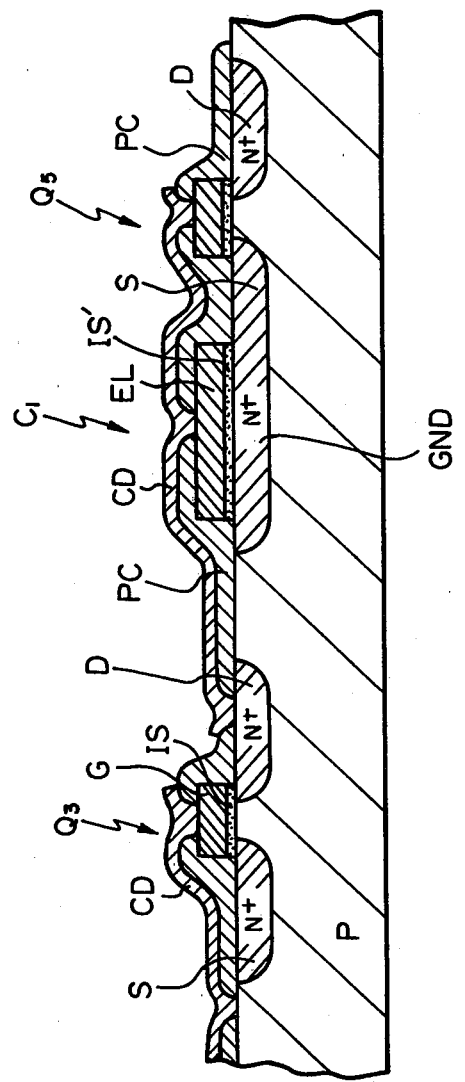
FIG. 10 is a cross sectional view of, for example MOSFET $Q_3$, capacitor $C_1$ and MOSFET $Q_5$ shown in FIG. 3.

FIG. 10 is a cross sectional view of, for example, the MOSFET $Q_3$, the capacitor $C_1$ and the MOSFET $Q_5$ shown in FIG. 3. It should be understood that identical members, such as the MOSFET $Q_6$, the capacitor $C_2$ and the MOSFET $Q_8$ in FIG. 3, the MOSFET $Q_{13}$ ($Q_{16}$), the capacitor $C_{12}$ ($C_{11}$) and the MOSFET $Q_{15}$ ($Q_{12}$) in FIG. 6, will also provide the same sectional views as shown in FIG. 10. In this figure, the members represented by the same reference symbols as those of FIG. 1 are identical with each other. The capacitor $C_1$ is fabricated by an N+-type region, acting as the ground (GND) and also the source of the MOSFET $Q_5$, an insulation layer IS' and an electrode EL, made of aluminum or polysilicon. The reference symbols CD represent conductive layers, acting as lead conductors, made of, for example aluminum. It should be recognized that the gate electrode G of the MOSFET $Q_3$, acting as a part of the aforesaid CR circuit, is directly connected to the substrate SUB, via the conductor CD. Although, in FIG. 1, the oscillator OSC is separately located with respect to the substrate SUB, it is preferable, in the present invention, to mount the oscillator OSC directly on the substrate SUB, so that the gate electrodes of the MOSFETs, acting as the resistors (R) of the CR circuits, may easily be connected to the substrate SUB. The reference symbols PC represent protective covers, formed by insulation layers.

As explained in detail, the bias-voltage generator of the present invention can maintain the voltage level of the substrate at a predetermined optimum level, without introducing any special and complicated devices therein. Further, the bias-voltage generator of the present invention can automatically compensate for a deviation of the threshold voltage Vth, which the deviation is necessarily produced during a manufacturing process. That is, if the threshold voltage Vth of the produced MOSFET, such as the MOSFET $Q_3$, $Q_6$ and so on, is lower than the predetermined threshold voltage Vth, the oscillating frequency of the oscillator OSC becomes high. Then the voltage level of the substrate goes toward "L" level. As a result, the threshold voltage Vth of the produced MOSFET, shifts toward high threshold voltage level. Contrary to this, if the threshold voltage Vth of the produced MOSFET, is higher than the predetermined threshold voltage Vth, the oscillating frequency of the oscillator OSC becomes low. Then the voltage level of the substrate goes toward "H" level. As a result, the threshold voltage Vth of the produced MOSFET shifts toward low threshold voltage level.

What is claimed is:

1. A bias-voltage generator for applying a bias voltage to a semiconductor substrate having an integrated circuit thereon, said generator comprising:

an oscillator producing an oscillating AC signal, said oscillator comprising an RC circuit for varying the frequency of said oscillating AC signal in response to variations of the voltage level of said semiconductor substrate, said RC circuit including a capacitor (C) and a variable resistance (R) comprising a MOSFET having a gate electrode directly connected to the semiconductor substrate such that said variable resistance varies in accordance with the variations of the voltage level of the semiconductor substrate;

a coupling capacitor connected, at one end thereof, to the output of said oscillator; and a charge pumping circuit for absorbing electric charges accumulated in said semiconductor substrate, connected firstly to the other end of said coupling capacitor, secondly to a ground of said integrated circuit, and thirdly to said semiconductor substrate, wherein the oscillating frequency of said oscillating AC signal produced by said oscillator varies in proportion to the variation of the voltage level of said semiconductor substrate.

2. A generator as set forth in claim 1, wherein said RC circuit is mounted on the semiconductor substrate together with a desired MOS integrated circuit.

3. A generator as set forth in claim 1,
   wherein said oscillator comprises an odd number of inverters,
   wherein at least one RC circuit is inserted between at least one pair of said inverters,
   and wherein said inverters and at least one said RC circuit are connected in series so as to form a ring oscillator.

4. A generator as set forth in claim 1, wherein said oscillator is formed as a multivibrator, comprised of:
   a cross-connected pair of MOSFETS,
   a pair of load transistors, each load transistor being operatively connected to a corresponding one of said pair of MOSFETS, and
   two of said RC circuits, wherein said cross-connected pair of MOSFETS are interconnected with each other, at respective drains and gate electrodes thereof, via said RC circuits.

5. A generator as set forth in claim 3, wherein each of said inverters comprises both a depletion-type load MOSFET and an enhancement-type MOSFET, and wherein said MOSFET variable resistance of at least one said RC circuit is a depletion-type MOSFET.

* * * * *

UNITED STATES PATENT AND TRADEMARK OFFICE
CERTIFICATE OF CORRECTION

PATENT NO. : 4,390,798
DATED : JUNE 28, 1983
INVENTOR(S) : SETSUO KURAFUJI

It is certified that error appears in the above-identified patent and that said Letters Patent is hereby corrected as shown below:

Col. 1, line 39, "which" should be --with--.

Col. 3, line 31, after "including" insert --such--.

Col. 5, line 55, after "increase" insert --,--.

Col. 6, line 8, "waveform" should be --waveforms--.

Signed and Sealed this

Eighth Day of November 1983

[SEAL]

Attest:

GERALD J. MOSSINGHOFF

Attesting Officer    Commissioner of Patents and Trademarks